(12) United States Patent
Cho et al.

(10) Patent No.: US 7,750,706 B1
(45) Date of Patent: Jul. 6, 2010

(54) CIRCUITS, ARCHITECTURES, APPARATUSES, SYSTEMS, AND METHODS FOR LOW VOLTAGE CLOCK DELAY GENERATION

(75) Inventors: Thomas B. Cho, Fremont, CA (US); Xiaoyue Wang, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 191 days.

(21) Appl. No.: 11/879,080

(22) Filed: Jul. 13, 2007

Related U.S. Application Data

(60) Provisional application No. 60/807,948, filed on Jul. 21, 2006.

(51) Int. Cl.
*H03K 3/289* (2006.01)

(52) U.S. Cl. .................. 327/202; 327/147; 327/158; 327/161; 327/277; 327/291

(58) Field of Classification Search ................ 327/147, 327/156, 158, 161, 277, 291, 299, 199, 200, 327/201, 202
See application file for complete search history.

(56) References Cited

U.S. PATENT DOCUMENTS

| | | | |
|---|---|---|---|
| 5,502,410 A * | 3/1996 | Dunn et al. ................. | 327/140 |
| 6,313,681 B1 * | 11/2001 | Yoshikawa ................. | 327/277 |

\* cited by examiner

*Primary Examiner*—Lincoln Donovan
*Assistant Examiner*—John W Poos

(57) ABSTRACT

Circuits, systems, and methods for generating a delayed clock signal. The circuit generally includes a first ramp generator configured to produce a first ramp signal in response to a reference clock signal, a first comparison circuit configured to compare the first ramp signal to a first threshold value in response to the reference clock signal to produce a comparison signal, a second ramp generator configured to produce a second ramp signal in response to the comparison signal, and a second comparison circuit configured to compare the second ramp signal to a second threshold value to produce the delayed clock signal.

25 Claims, 11 Drawing Sheets

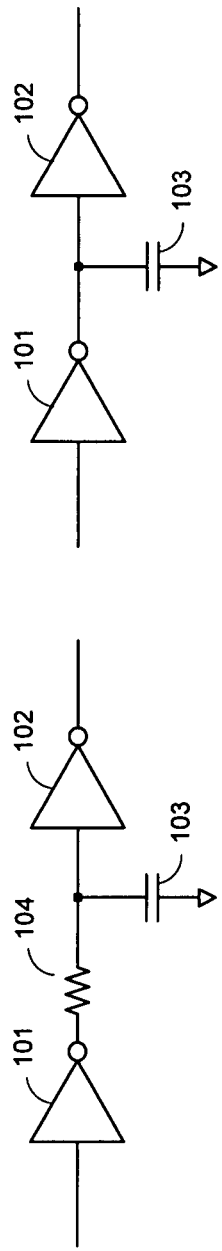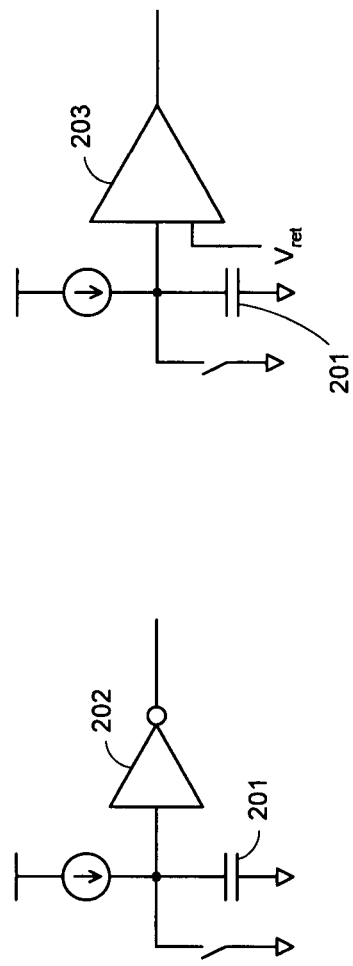
FIG. 1
(Background)
FIG. 2
(Background)

(Background)

CIRCUITS, ARCHITECTURES, APPARATUSES, SYSTEMS, AND METHODS FOR LOW VOLTAGE CLOCK DELAY GENERATION

RELATED APPLICATIONS

This application claims the benefit of U.S. Provisional Application No. 60/807,948, filed Jul. 21, 2006, incorporated herein by reference in its entirety.

FIELD OF THE INVENTION

The present invention generally relates to the field of clock delay generation circuits. More specifically, embodiments of the present invention pertain to circuits, architectures, systems, and methods for low power clock delay generation.

DISCUSSION OF THE BACKGROUND

In high speed integrated circuits, clocks are vital to accurately synchronize various components. For example, a pipeline analog-to-digital converter (ADC) may use two or more steps involving different subranges of resolution. First, a coarse conversion is done. In a second step, the difference to the input signal is determined with a digital to analog converter (DAC). This difference is then converted to a finer resolution, and the results are combined in a last step. This type of ADC is fast, has a high resolution, and may consume a relatively small die size. In such an application, the clock edge which determines the comparator strobe instance should be positioned with a high degree of accuracy independent of process, voltage, and temperature (PVT) variations.

Methods for controlling the position of the clock edge (e.g., the clock delay) are known in the art. Several conventional methods exist to generate a clock delay. For example, an RC-type delay as shown in FIG. 1 acts by charging/discharging a capacitor 103 between inverters 101 and 102. Capacitor 103 often comprises a MOS capacitor, a metal fringing capacitor, or a metal-insulator-metal (MIM) capacitor. When a resistor 104 is used, it often comprises a polysilicon resistor. However, the capacitance of capacitor 103 and the resistance of resistor 104 are strongly dependant on process, voltage, and temperature (PVT) variations. For example, the capacitance can vary by as much as 20% over PVT variations.

Another conventional clock delay generator is the IC type, as shown in FIG. 2. An IC type clock delay generator generally comprises a current charging capacitor 201 followed by either an inverter 202 or a comparator 203. In this type of delay circuit, variation of the inverter 202 threshold voltage across PVT corners may introduce significant delay dispersion. With a comparator 203, the comparator offset needs to be controlled within a generally narrow range. To amplify small voltage differences, the comparator needs to have high gain, which means lower bandwidth, because the gain bandwidth is generally fixed for a given process. The propagation delay due to the resulting low bandwidth may introduce undesirable variations in the amount of delay produced.

Yet another conventional clock delay generator is the delay-locked loop (DLL), as shown in FIG. 3. A DLL is a digital circuit similar to a phase-locked loop (PLL), with the main difference being the absence of an oscillator within the circuit. DLL 300 comprises a delay chain composed of many delay gates (e.g., inverters 301 to 3NN). The input of the chain is connected to the reference clock input 310. Such DLLs may be relatively complicated (and therefore consume a relatively large amount of space in an integrated circuit die) and are generally not power efficient enough for low power applications.

Therefore, it would be desirable to provide a low power clock delay with a high degree of accuracy, independent of process, voltage, and temperature (PVT) variations.

SUMMARY OF THE INVENTION

Embodiments of the present invention relate to circuits, systems, and methods for generating a delayed clock signal. The circuit generally comprises a first ramp generator configured to produce a first ramp signal in response to a reference clock signal, a first comparison circuit configured to compare the first ramp signal to a first threshold value in response to the reference clock signal to produce a comparison signal, a second ramp generator configured to produce a second ramp signal in response to the comparison signal, and a second comparison circuit configured to compare the second ramp signal to a second threshold value to produce the delayed clock signal.

In one embodiment of the circuit, the first ramp signal is configured to reach a peak level when the reference clock signal has a transition. In another embodiment, the first ramp generator is further configured to receive a first feedback signal. In a further embodiment, the circuit includes a first voltage controlled current source (VCCS) configured to produce the feedback signal in response to the first comparison signal. The circuit may further comprise a low pass filter configured to receive the first comparison signal and to produce a first filtered comparison signal and a first VCCS configured to produce the feedback signal in response to the first filtered comparison signal. Alternatively, the circuit may comprise a first VCCS configured to produce the feedback signal in response to the first comparison signal. In a preferred embodiment, the ramp generator includes a first capacitor.

In yet another embodiment, the second ramp generator comprises a second VCCS configured to produce a ramp control signal in response to the first comparison signal. In a further embodiment, the second VCCS comprises a replica of the first VCCS. Furthermore, the second ramp generator comprises may comprise a second capacitor.

In one embodiment, the first VCCS comprises at least one transistor having a first finger number, and the second VCCS comprises at least one transistor having a second finger number. In a further embodiment, the delayed clock signal may have a pulse width $\Delta t$ according to the equation:

$$\Delta t = T_{H1} * \frac{C_2 * M_1}{C_1 * M_2},\qquad\text{(EQ. 1)}$$

wherein $C_1$ is the capacitance of the first capacitor, $C_2$ is the capacitance of the second capacitor, $M_1$ is the first finger number, $M_2$ is the second finger number, and $T_{H1}$ is the pulse width of the reference clock signal.

In another embodiment, the first comparison circuit includes a first comparator configured to compare the first ramp signal to the first threshold value and a level shifting circuit configured to level shift an output of the first comparator to produce the comparison signal. In a further embodiment, the ramp generator comprises a first capacitor. The first capacitor generally has an average current flowing through it when the reference clock signal is high according to the equation:

$$I_{VCCS1} = V_T * \frac{C_1}{T_{H1}}, \quad \text{(EQ. 2)}$$

wherein $I_{vccs1}$ is the average current flowing through the first capacitor when the reference clock signal is high, $V_T$ is the threshold value of the first comparator, $C_1$ is the capacitance of the first capacitor, and $T_{H1}$ is the pulse width of the reference clock signal.

The architectures and/or systems generally comprise those that include a circuit embodying one or more of the inventive concepts disclosed herein. For example, an analog-to-digital converter may incorporate the present circuit.

The method includes the steps of generating a first ramp signal in response to a reference clock signal, comparing the first ramp signal to a first threshold value in response to the reference clock signal to produce a comparison output, generating a second ramp signal in response to the comparison signal, and comparing the second ramp signal to a second threshold value to produce the delayed clock signal.

In one embodiment, the method further includes adjusting the first ramp signal in response to the comparison signal. In a further embodiment, the first ramp signal reaches a peak level when the reference clock signal has a transition. In another embodiment, producing the comparison signal comprises level shifting the comparison signal to produce a level-shifted output. In a further embodiment, producing the comparison signal further comprises low-pass filtering the level-shifted output.

In still another embodiment, the adjusting step comprises generating a feedback signal with a voltage controlled current source. The adjusting step may also include applying an average current through a first capacitor when the reference clock signal is high, where the average current may be calculated according to EQ. 2, above.

In one exemplary embodiment, the step of generating the first ramp signal comprises producing a first voltage controlled current in response to the comparison signal and the step of generating the second ramp signal comprises producing a second voltage controlled current in response to the comparison signal. The step of generating the first ramp signal may further comprise applying the first voltage controlled current to a first capacitor, and the step of generating the second ramp signal may further comprise applying the second voltage controlled current to a second capacitor. In a further embodiment, producing the first voltage controlled current comprises applying the comparison signal to a first VCCS, and producing the second voltage controlled current comprises applying the comparison signal to a second VCCS. In a preferred embodiment, the delayed clock signal has a pulse width Δt according to EQ. 1, above.

The present invention advantageously provides clock delay generation at low power with a high degree of accuracy, independent of process, voltage, and temperature (PVT) variations.

These and other advantages of the present invention will become readily apparent from the detailed description of preferred embodiments below.

BRIEF DESCRIPTION OF THE DRAWINGS

FIG. 1 is a diagram showing conventional RC-type clock delay generators.

FIG. 2 is a diagram showing conventional IC-type clock delay generators.

DETAILED DESCRIPTION OF THE PREFERRED EMBODIMENTS

Figure 3:
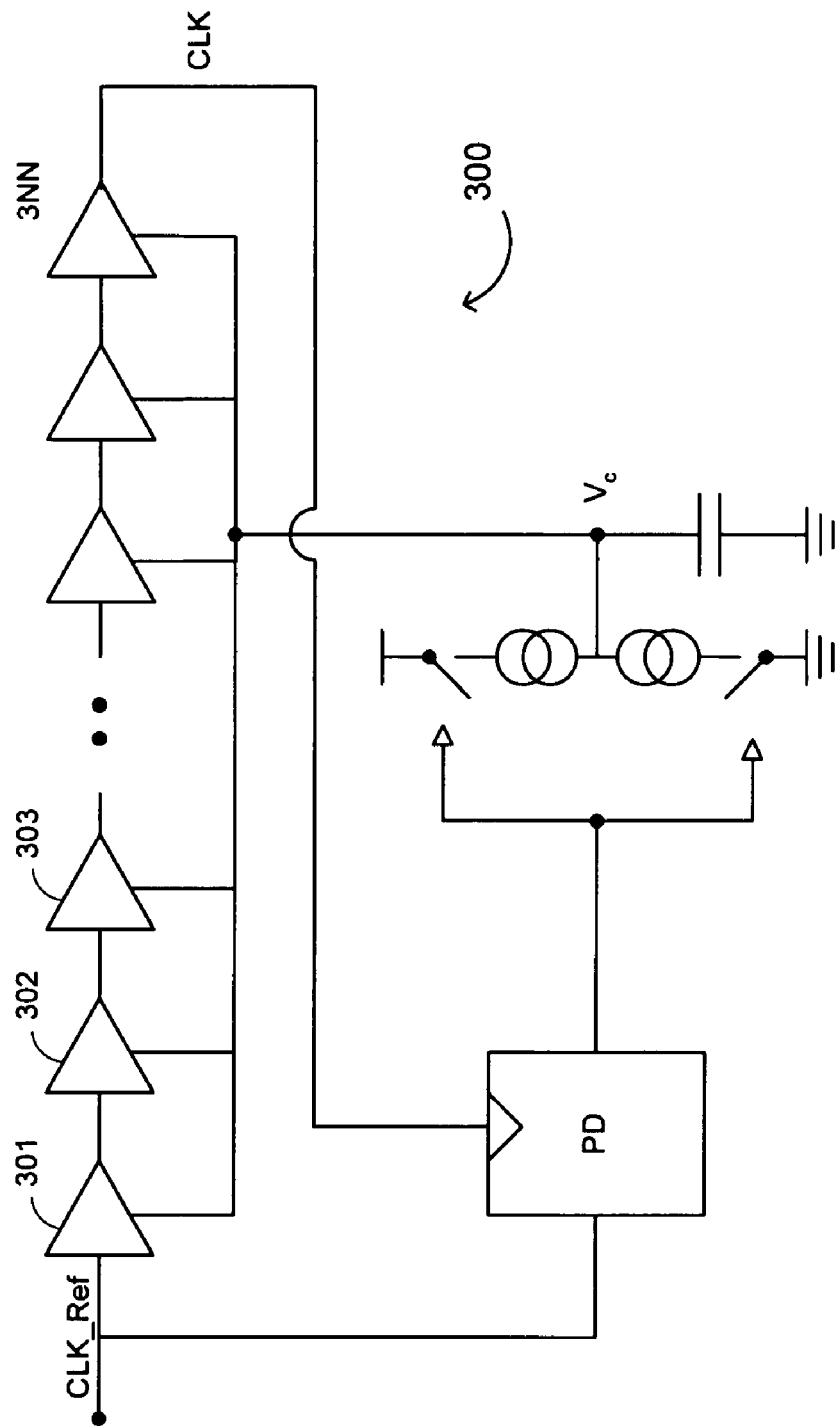
FIG. 3 is a diagram showing a conventional delay-locked loop (DLL) clock delay generator.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams, or waveforms within a computer, processor, controller, and/or memory. These descriptions and representations are generally used by those skilled in the data processing arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer, data processing system, or logic circuit. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "clock," "time," "rate," "period" and "frequency" are generally used interchangeably herein, but are generally given their art-recognized meanings. Also, for convenience and simplicity, the terms "data," "data stream," "waveform" and "information" may be used interchangeably, as may the terms "connected to," "coupled with," "coupled to," and "in communication with" (which terms also refer to direct and/or indirect relationships between the connected, coupled and/or communication elements unless the context of the term's use unambiguously indicates otherwise), but these terms are also generally given their art-recognized meanings.

The invention, in its various aspects, will be explained in detail below with regard to exemplary embodiments.

An Exemplary Circuit and/or Architecture

Conceptually, the circuit of the present invention may be thought of as having a master loop and a slave branch. The master loop generally produces a signal containing process, voltage, and temperature (PVT) information as well as clock pulse width information. The present invention is advantageously free of conventional operational amplifiers, and is suitable for low voltage applications.

Figure 4:
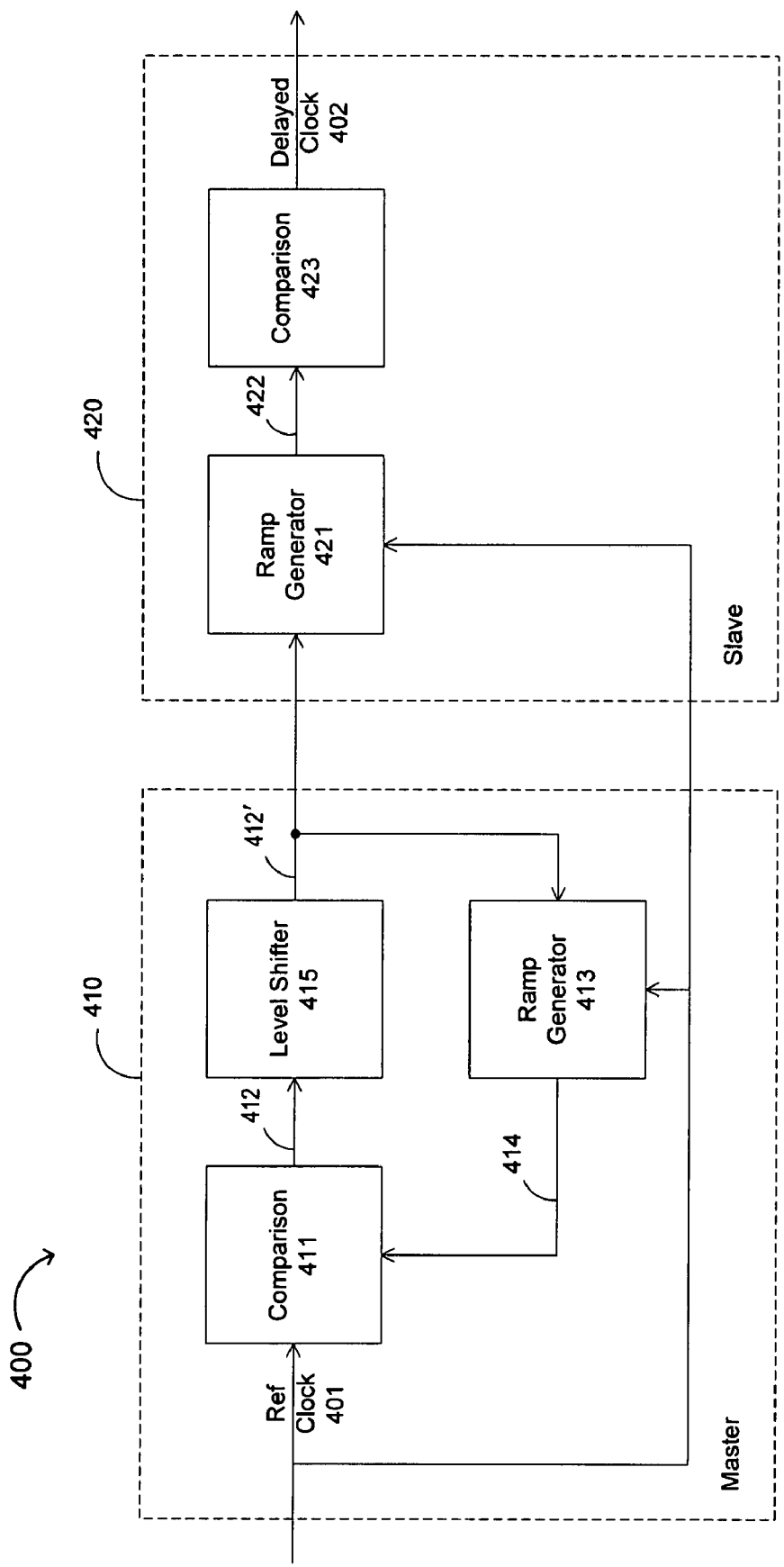
FIG. 4 is a high level diagram showing a clock delay generator according to the present invention.

Referring now to FIG. 4, a diagram of a clock delay generator 400 according to one embodiment of the present invention is shown. Master loop 410 generally comprises a first ramp generator 413 configured to produce a first ramp signal 414 in response to a reference clock signal 401, and first comparison circuit 411 configured to compare the first ramp signal 414 to a first threshold value and to produce a comparison signal 412.

Comparison circuit 411 may comprise, for example, an inverter and/or a comparator (e.g., a Schmitt-type trigger as described below) configured to compare the first ramp signal 414 to a first threshold value and a flip-flop configured to sample the output of the inverter (e.g., at a rising and/or falling edge of the reference clock). Master loop 410 may include a level shifter 415 to map the voltage levels of comparison signal 412 to a smaller (or larger) range of voltage levels to produce level-shifted comparison signal 412'.

In a preferred embodiment, ramp generator 413 receives comparison signal 412 or a derivative thereof (e.g., level-shifted comparison signal 412') as a feedback signal in order to adjust the ramp rate of the first ramp signal 414. Ramp generator 413 generally produces the ramp signal 414 having a substantially linear rising slope after an edge of the reference clock signal 401. Ramp signal 414 may then be reset, e.g., after a subsequent edge of the reference clock signal 401.

Ramp generator 413 may comprise, for example, one or more filters (e.g., a low pass filter) to filter comparison signal 412 (or a level-shifted or other derivative thereof). Ramp generator 413 may further comprise a current source (e.g., a voltage controlled current source) and a charging capacitor to produce the linear slope of the first ramp signal 414, and a switch or other device to reset the signal (e.g., to discharge the capacitor) upon a rising edge of the reference clock signal 401 or upon another event.

Slave branch 420 generally comprises a second ramp generator 421 configured to produce a second ramp signal 422 in response to the comparison signal 412 or a derivative thereof, and a second comparison circuit 423 configured to compare the second ramp signal 422 to a second threshold value to produce the delayed clock signal 402. Similar to ramp generator 413, ramp generator 421 may comprise a current source (e.g., a voltage controlled current source) and a charging capacitor to produce the linear slope of the second ramp signal 422, and a switch or other device to reset the signal (e.g., to discharge the capacitor) upon a rising edge of the reference clock signal 401 or upon another event. Comparison circuit 423 may comprise, for example, an inverter and/or a comparator (e.g., a Schmitt-type trigger as described below) configured to compare the second ramp signal 422 to a second threshold value to produce the delayed clock signal 402. The delay of delayed clock signal 402 with respect to reference clock signal 401 can be configured by controlling the relative slopes of first ramp signal 414 and second ramp signal 422. These slopes can be configured by, e.g., adjusting the characteristics of the current source(s), capacitor(s), or other component(s) in ramp generators 413 and 421.

Figure 5:
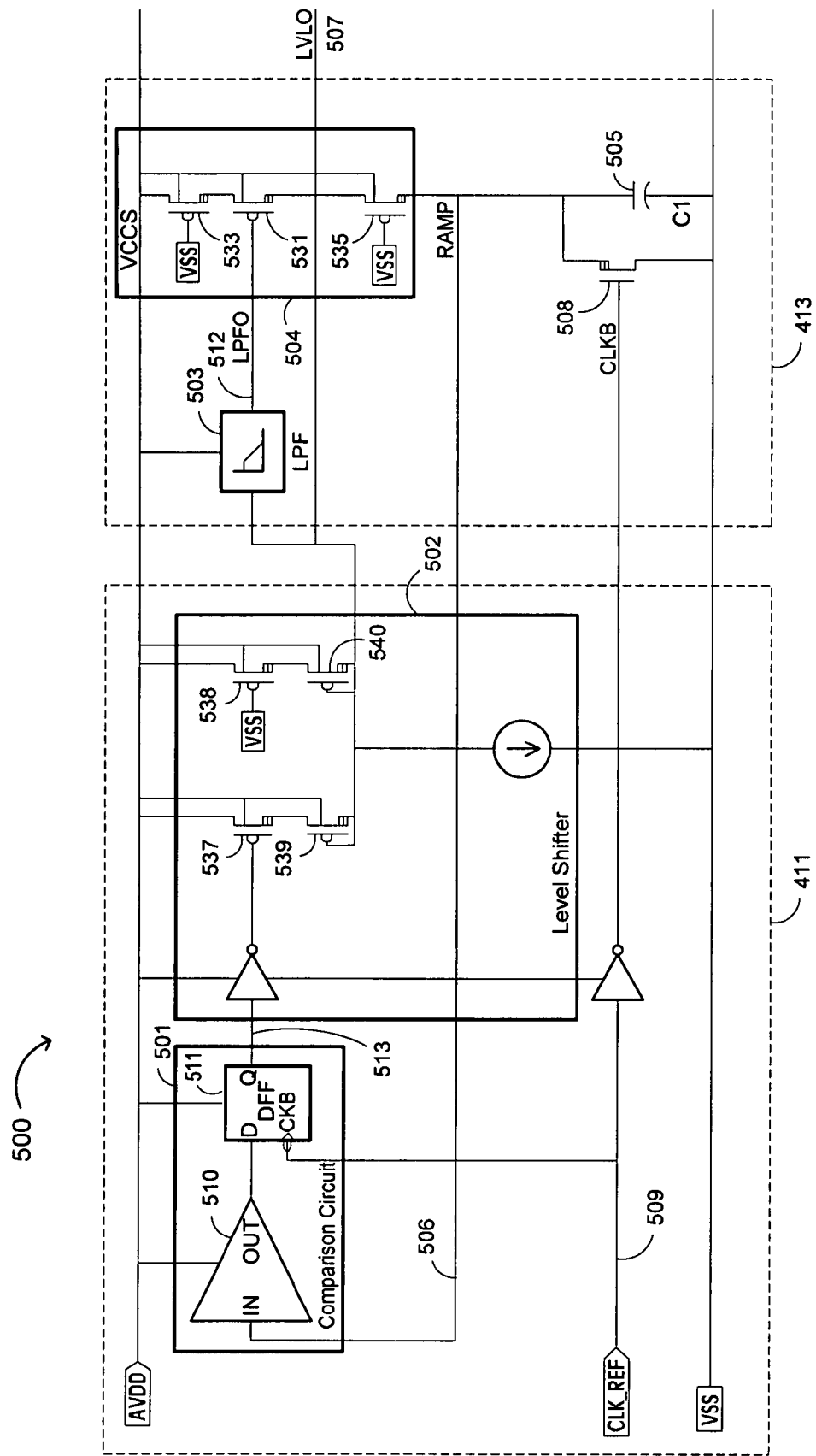
FIG. 5 is a detailed circuit diagram showing a master loop of a clock delay generator according to the present invention.

Referring now to FIG. 5, a detailed master loop circuit 500 is shown, generally corresponding to master loop 410 of FIG. 4. The master loop 500 comprises a comparison circuit 501 including a comparator 510 and a D-type flip-flop (DFF) 511. The circuit further comprises a level shifter 502, a low-pass filter 503, a first voltage controlled current source (VCCS) 504, and a capacitor 505. With respect to FIG. 4, first comparison circuit 411 generally comprises comparison circuit 501 and level shifter 502 of FIG. 5. First ramp generator 413 generally comprises low-pass filter 503, first VCCS 504, and capacitor 505 of FIG. 5.

Referring again to FIG. 5, comparison circuit 501 compares the signal level of its input, first ramp signal 506, with a built-in threshold $V_T$ immediately prior to each falling edge of the reference clock 509. The exact value for $V_T$ here is not critical when a comparator that is substantially identical to the master comparator (e.g., a comparator having the same $V_T$) is used in the slave branch as described below. In this case, $V_T$ will be cancelled out. Due to its fully digital nature, this comparison circuit generally has infinite gain, carries little or no detectable quiescent current, and can operate under very low supply voltage.

Comparator 510 may comprise a Schmitt trigger to suppress noise and to prevent "glitches" in the output waveform. With a Schmitt trigger, when the input is below a first threshold, the output is low; when the input is above a second (higher) threshold, the output is high; and when the input is between the two thresholds, the output retains its value. The benefit of a Schmitt trigger over a similar system with a single input threshold is that the Schmitt trigger is generally more stable. With only one input threshold, a noisy input signal near that threshold could rapidly switch back and forth, causing the output to switch back and forth from low to high. With the Schmitt trigger, a noisy input signal near one threshold could cause only one switch in output value, after which it would have to move to the other threshold in order to cause another switch. In this circuit, $V_T$ refers to the second (higher) threshold.

The level shifter 502 maps its input signal, which generally ranges from rail to rail (e.g., from AVDD to VSS), to a smaller voltage range. This smaller range of voltages may be, for example, from AVDD-VGSH to AVDD-VGSL, where VGSH and VGSL are the high and low values of the gate-to-source voltage drop (e.g., a voltage rail +/− the threshold voltage) of one or more transistors in the level shifter 502. Inserting the level shifter 502 between comparison circuit 501 and the LPF 503 has the following advantages: (1) more relaxed low-pass filter design due to reduced voltage variations; (2) improved power supply rejection ratio (PSRR) with reference to the power supply; and (3) a reduced convergence time. Thus, in one embodiment the master loop may comprises a first comparator configured to compare the first ramp signal to the first threshold value, and a level shifting circuit configured to level shift an output of the first comparator to produce the comparison signal.

With respect to the master loop 410 of FIG. 4, the first ramp generator 413 may comprise, for example, low-pass filter 503, voltage controlled current source 504, charging capacitor 505, and switch (or reset circuit) 508. Low-pass filter 503 may comprise a first-order low-pass filter. Low-pass filter 503 generally suppresses variations in and/or extracts a mean value from the output of level shifter 502. VCCS 504 may comprise PMOS transistors 531, 533, and 535. Top PMOS transistor 533 may comprise a replica of transistors 537 and 538 of level shifter 502. Transistor 535 generally serves as a shielding device, alleviating disturbances of the output of LPF 503 caused by the first ramp signal through transistor 531.

Referring again to FIG. 5, charging capacitor 505 may be configured to produce the linear slope of the first ramp signal 506. Switch 508 (or other device) may be configured to reset the first ramp signal 506 by, for example, discharging capacitor 505 upon a rising edge of the reference clock 509 or upon another event.

Ramp signal 506 may be generated by charging and discharging capacitor 505. Capacitor 505 is generally periodically discharged by reset circuit or switch 508 (e.g., at every cycle of the reference clock [CLK_REF] 509). For example, when switch 508 comprises a PMOS transistor, the capacitor 505 may be discharged or reset when the reference clock signal 509 is low. In one exemplary implementation, as shown in FIG. 5, master loop 500 dynamically drives the ramp generator to equilibrium. Assuming the initial level of output 512 of LPF 503 is high, transistor 531 is turned off, resulting in no current flowing through VCCS 504 on ramp output 506. Thus, when comparison circuit 501 compares ramp output 506 to reference clock 509, output 513 of comparison circuit 501 will be low, resulting in the output of level shifter 502 also having a low value. Over many cycles of the reference clock signal 509, output 512 of LPF 503 will be steered downward. Accordingly, more current will be passed to capacitor 505. This process will continue until a balance point is reached, such that the level of the first ramp signal equals the threshold value of a threshold-triggered comparator 510 (e.g., a Schmitt-type trigger) immediately before the following edge of the reference clock signal 509.

When the first ramp signal 506 is higher than the threshold value of comparator 510 (e.g., due to noise or other variations), output 513 of comparison circuit 501 will generally be high, resulting in a high value of output 507 of level shifter 502, and thereby steering the output of LPF 503 upward. Therefore, the output current of VCCS 504 will generally be reduced, causing the first ramp signal 506 to rise more slowly.

Figure 6:
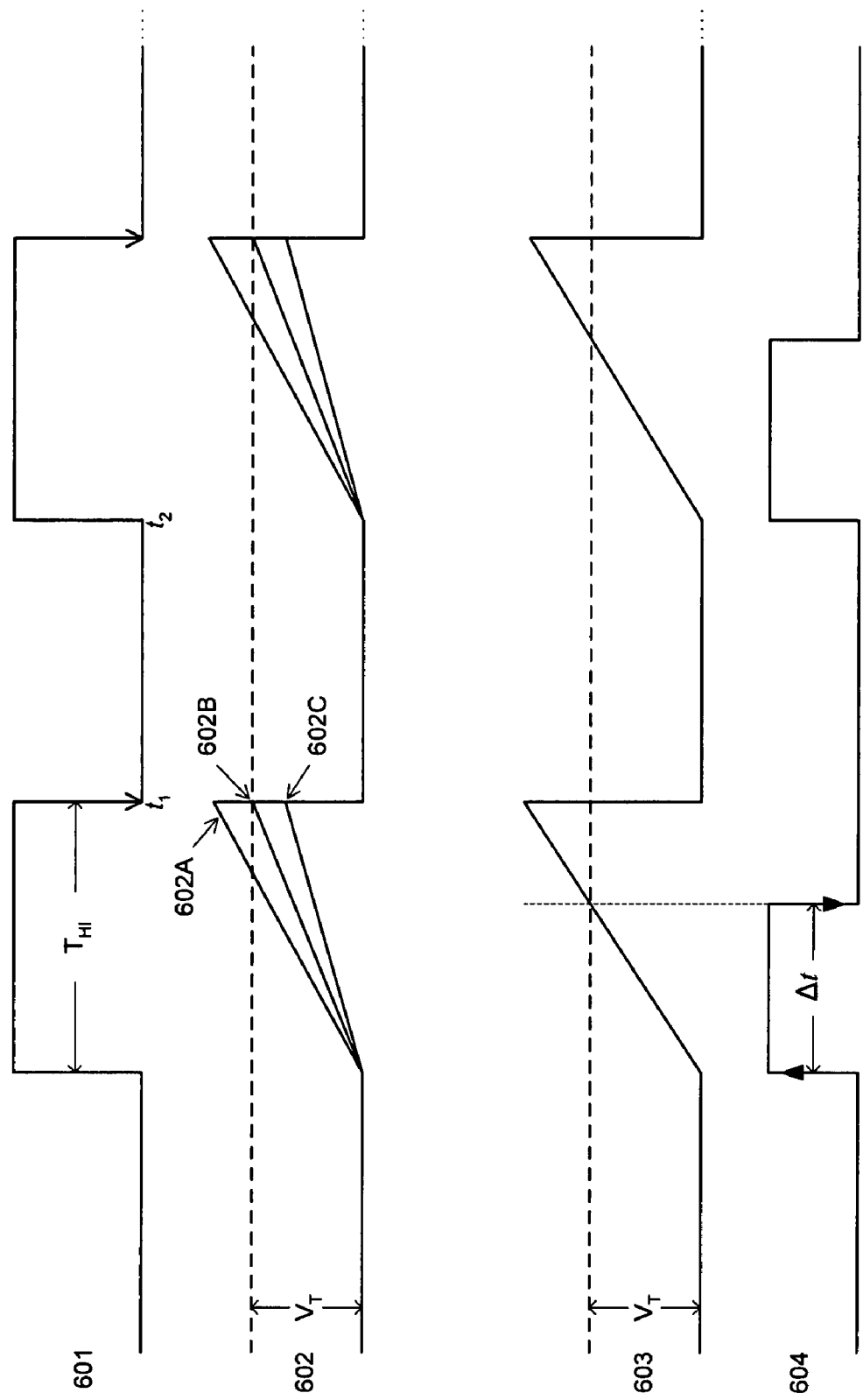
FIG. 6 is a diagram of waveforms of a clock delay generator according to the present invention.

Referring now to FIG. 6, exemplary waveforms are shown. Waveform 601 shows the reference clock signal 509 with pulse width $T_{HI}$. Waveform 602 shows the first ramp signal and threshold level $V_T$. When the ramp signal rises too quickly, as with ramp 602A, the master loop will generally drive the ramp generator to go more slowly. When the ramp rises too slowly, as with ramp 602C, the master loop will drive the ramp generator to rise more quickly. In each case, the ramp generator will, over time, reach an equilibrium wherein the ramp signal reaches threshold level $V_T$ at the same time that reference clock REF_CLK is at a falling edge (e.g., at time $t_1$ in waveform 601). The master loop is thus a robust dynamic negative feedback loop which will generally find its balancing point, moving around ramp 602B due to noise and environmental fluctuation. When this balance has been reached, the capacitor 505 generally has an average current flowing through it (when the reference clock signal is high) according to EQ. 2, above, wherein $I_{vccs1}$ is the average current flowing through the capacitor 505, $V_T$ is the threshold value of comparator 510, $C_1$ is the capacitance of the capacitor 505, and $T_{HI}$ is the pulse width of the reference clock signal 509.

Figure 7:
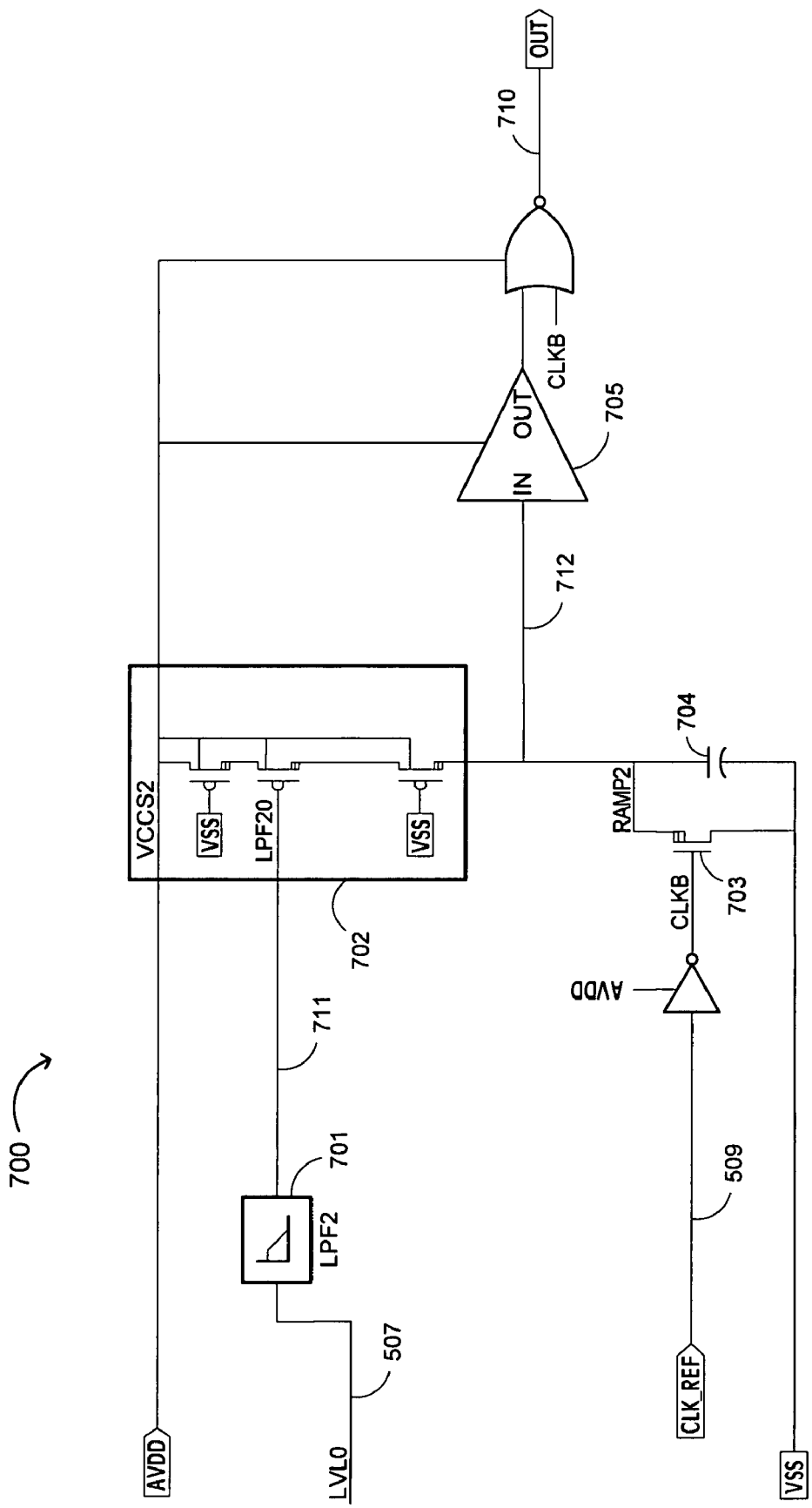
FIG. 7 is a detailed circuit diagram showing a slave branch of a clock delay generator according to the present invention.

Referring now to FIG. 7, slave branch 700 comprises a second low-pass filter 701, a second VCCS 702, a second charging capacitor 704, and comparator 705 (e.g., a Schmitt-type trigger). VCCS 702 and comparator 705 generally replicate VCCS 504 and comparator 510 in the master loop 500, respectively. LPF 701 generally suppresses voltage ripple from output 507 of level shifter 502 of master loop 500. Thus, output 711 of LPF 701 generally comprises a relatively "clean" version of output 507.

Referring again to FIG. 6, waveform 603 shows the second ramp signal and threshold level $V_T$. At the rising edge of reference clock waveform 601, the second ramp signal waveform 603 begins to ramp from 0V. The slope of the second ramp signal generally depends on the charging current from second VCCS 702 and the capacitance of second capacitor 704.

Referring again to FIGS. 5 and 7, the charging current provided by both first VCCS 504 and second VCCS 702 depend, in part, on the "finger number" of the component transistors. Conventionally, an integrated circuit may have a plurality of transistor cells having different numbers of emitter electrodes or other output terminals (hereinafter referred to as "a finger number"), arranged in one semiconductor chip or circuit block thereof. A transistor cell (or a combination of transistor cells) having a predetermined finger number may be selected during operation. Thus, the delay of the present clock delay generator can be altered or changed by selecting transistors with different finger numbers.

Referring again to FIG. 6, when the level of the second ramp signal 603 reaches the threshold value $V_T$ of the second comparator 705, the comparator 705 will generally produce a rising edge at its output. Waveform 604 shows the output delayed clock signal 710 with pulse width $\Delta t$. The pulse width $\Delta t$ of the output clock is given by the following equation:

$$\Delta t = V_T * \frac{C_2}{I_{VCCS2}} = V_T * \frac{C_2 * M_1}{I_{VCCS2} * M_2}, \quad \text{(EQ. 3)}$$

wherein $M_1$ and $M_2$ are the finger numbers of first VCCS 504 and second VCCS 702, respectively.

By combining EQ. 2 with EQ. 3, pulse width Δt can be calculated according to EQ. 1, above, wherein $C_1$ is the capacitance of the first capacitor 506, $C_2$ is the capacitance of the second capacitor 704, $M_1$ is the first finger number, $M_2$ is the second finger number, and $T_{HI}$ is the pulse width of the reference clock signal 509. Thus, the value of Δt can be adjusted by varying the ratios of $C_2/C_1$ and/or $M_2/M_1$. These values may be chosen during circuit design, or variable components may be used so that the delay may be set during operation of the circuit. The accuracy of the circuit is generally limited by the matching of the voltage controlled current sources, charging capacitors, and the value of $V_T$ between the master loop and the slave branches.

Exemplary Methods

Figure 8:
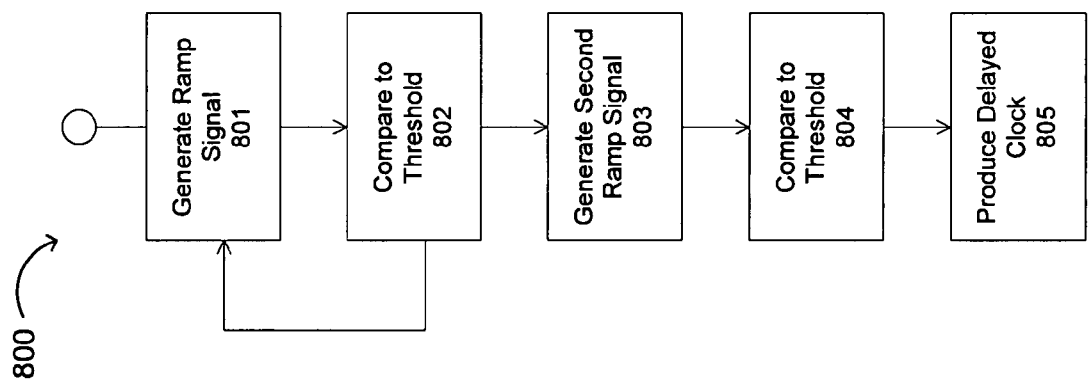
FIG. 8 is a flow chart of a method according to the present invention.

Referring now to FIG. 8, an exemplary flowchart of the present method is show. Step 801 comprises generating a ramp signal in response to a reference clock signal. Step 802 comprises comparing the first ramp signal to a first threshold value in response to the reference clock signal to produce a comparison signal. In a preferred embodiment, the method further comprises adjusting the first ramp signal in response to the comparison signal. As described with respect to the circuit above, adjusting the first ramp signal in response to the comparison signal allows a balance point to be reached, such that the level of the first ramp signal equals the first threshold value immediately before the following edge of the reference clock signal. Thus, in a further embodiment of the present invention, the first ramp signal is configured to reach a peak level when the reference clock signal has a predetermined transition. The method may comprise producing the first ramp signal with a linear slope by, for example, charging a capacitor during a pulse of the reference clock signal, and discharging the capacitor or otherwise resetting the first ramp signal upon the occurrence of a predetermined transition of the reference clock.

Referring again to FIG. 8, step 803 comprises generating a second ramp signal in response to the comparison signal. Step 804 comprises comparing the second ramp signal to a second threshold value. In a preferred embodiment, the first and second threshold values may be the same. In that case, the second ramp signal will cross the threshold at a time that depends on the ratio of the ramp speeds between the first ramp signal and the second ramp signal. Step 805 comprises producing the delayed clock. For example, step 805 may comprise producing the delayed clock in response to the time at which the second ramp signal crosses the second threshold.

In one exemplary embodiment, the step of producing the comparison signal comprises level shifting the comparator output to produce a level-shifted output (e.g., using level shifter 502 of FIG. 5, as described above). In a further embodiment, the step of producing the comparison signal further comprises low-pass filtering the level-shifted output.

Referring again to FIG. 6, when the level of the second ramp signal 603 reaches the threshold value $V_T$ of the second comparator 705, the comparator will generally produce a rising edge at its output. Waveform 604 shows the output delayed clock signal 710 with pulse width Δt. The pulse width Δt of the output clock is given by equations (2) and (3), above. When the first and second thresholds are the same (e.g., the first and second thresholds equal $V_T$ of equation (2)), the value of Δt can be adjusted by varying the ratios of $C_2/C_1$ and/or $M_2/M_1$. These values may be chosen during circuit design, or variable components may be used so that the delay may be set during operation of the circuit. The accuracy of the circuit is generally limited by the matching of the voltage controlled current sources, charging capacitors, and the value of $V_T$ between the master loop and the slave branches.

Exemplary Systems

Figure 9B:
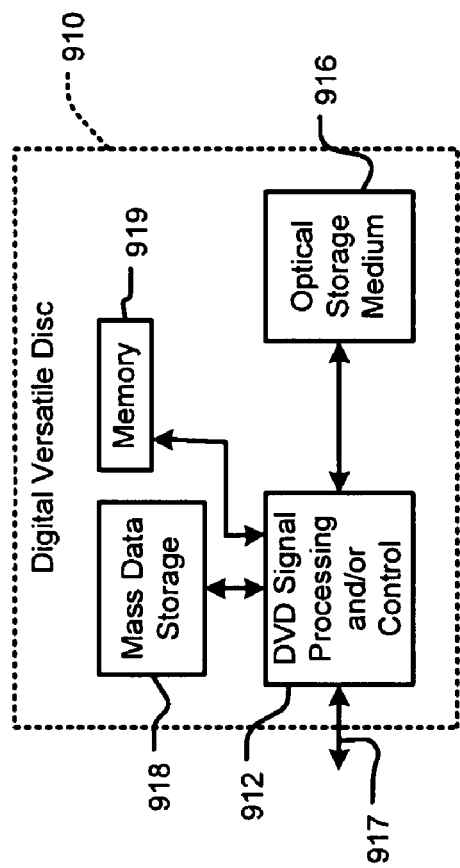
FIG. 9B is a diagram of an exemplary high definition television (HDTV).
Figure 9A:
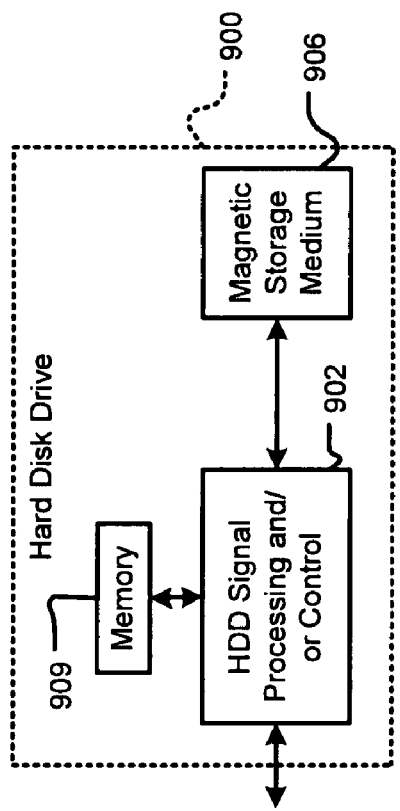
FIG. 9A is a diagram of an exemplary digital versatile disc (DVD) player.

Various exemplary implementations of the present invention are shown in FIGS. 9A-9G. Referring now to FIG. 9A, the present invention can be implemented in a hard disk drive (HDD) 900. The present invention may be implemented in either or both signal processing and/or control circuits, which are generally identified in FIG. 9A at 902. In some implementations, the signal processing and/or control circuit 902 and/or other circuits (not shown) in the HDD 900 may process data, perform coding and/or encryption, perform calculations, and/or format data that is output to and/or received from a magnetic storage medium 906.

The HDD 900 may communicate with a host device (not shown) such as a computer, mobile computing devices such as personal digital assistants, cellular phones, media or MP3 players and the like, and/or other devices via one or more wired or wireless communication links 908. The HDD 900 may be connected to memory 909 such as random access memory (RAM), low latency nonvolatile memory such as flash memory, read only memory (ROM) and/or other suitable electronic data storage.

Referring now to FIG. 9B, the present invention can be implemented in a digital versatile disc (DVD) drive 910. The present invention may be implemented in either or both signal processing and/or control circuits, which are generally identified in FIG. 9B at 912, and/or mass data storage of the DVD drive 910. The signal processing and/or control circuit 912 and/or other circuits (not shown) in the DVD 910 may process data, perform coding and/or encryption, perform calculations, and/or format data that is read from and/or data written to an optical storage medium 916. In some implementations, the signal processing and/or control circuit 912 and/or other circuits (not shown) in the DVD 910 can also perform other functions such as encoding and/or decoding and/or any other signal processing functions associated with a DVD drive.

The DVD drive 910 may communicate with an output device (not shown) such as a computer, television or other device via one or more wired or wireless communication links 917. The DVD 910 may communicate with mass data storage 918 that stores data in a nonvolatile manner. The mass data storage 918 may include a hard disk drive (HDD). The HDD may have the configuration shown in FIG. 9A. The HDD may be a mini HDD that includes one or more platters having a diameter that is smaller than approximately 1.8". The DVD 910 may be connected to memory 919 such as RAM, ROM, low latency nonvolatile memory such as flash memory and/or other suitable electronic data storage.

Figure 9D:
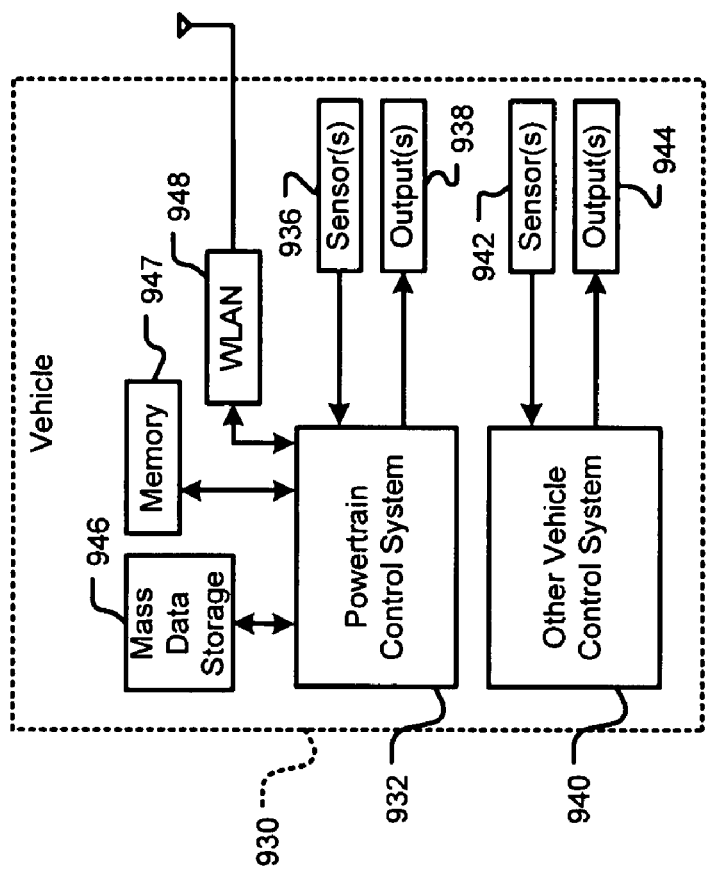
FIG. 9D is a diagram of an exemplary cellular or mobile phone.
Figure 9C:
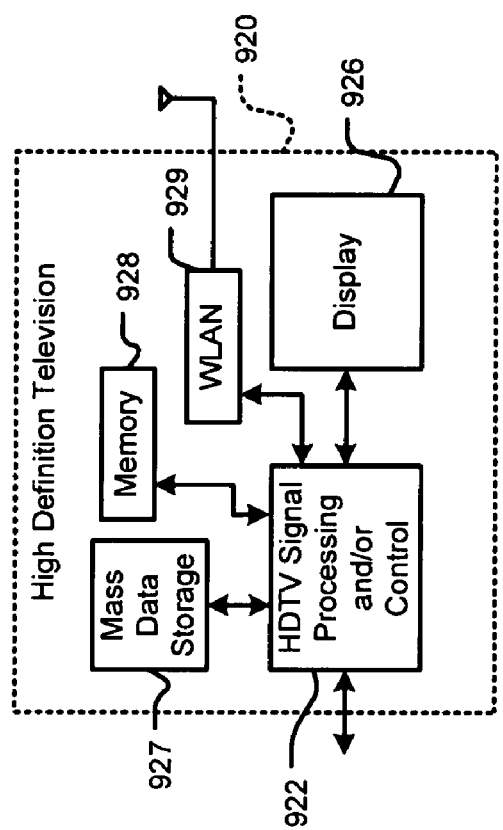
FIG. 9C is a diagram of an exemplary vehicle control system.

Referring now to FIG. 9C, the present invention can be implemented in a high definition television (HDTV) 920. The present invention may be implemented in either or both signal processing and/or control circuits, which are generally identified in FIG. 9E at 922, a WLAN interface and/or mass data storage of the HDTV 920. The HDTV 920 receives HDTV input signals in either a wired or wireless format and generates HDTV output signals for a display 926. In some implementations, signal processing circuit and/or control circuit 922 and/or other circuits (not shown) of the HDTV 920 may process data, perform coding and/or encryption, perform calculations, format data and/or perform any other type of HDTV processing that may be required.

The HDTV 920 may communicate with mass data storage 927 that stores data in a nonvolatile manner such as optical and/or magnetic storage devices. At least one HDD may have the configuration shown in FIG. 9A and/or at least one DVD may have the configuration shown in FIG. 9B. The HDD may be a mini HDD that includes one or more platters having a diameter that is smaller than approximately 1.8". The HDTV 920 may be connected to memory 928 such as RAM, ROM, low latency nonvolatile memory such as flash memory and/or other suitable electronic data storage. The HDTV 920 also may support connections with a WLAN via a WLAN network interface 929.

Referring now to FIG. 9D, the present invention implements a control system of a vehicle 930, a WLAN interface, and/or mass data storage of the vehicle control system. In some implementations, the present invention implement a powertrain control system 932 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 990 of the vehicle 930. The control system 990 may likewise receive signals from input sensors 992 and/or output control signals to one or more output devices 944. In some implementations, the control system 990 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 932 may communicate with mass data storage 996 that stores data in a nonvolatile manner. The mass data storage 996 may include optical and/or magnetic storage devices (for example, hard disk drives [HDDs] and/or DVDs). At least one HDD may have the configuration shown in FIG. 9A and/or at least one DVD may have the configuration shown in FIG. 9B. The HDD may be a mini HDD that includes one or more platters having a diameter that is smaller than approximately 1.8". The powertrain control system 932 may be connected to memory 997 such as RAM, ROM, low latency nonvolatile memory such as flash memory and/or other suitable electronic data storage. The powertrain control system 932 also may support connections with a WLAN via a WLAN network interface 998. The control system 990 may also include mass data storage, memory and/or a WLAN interface (all not shown).

Figure 9E:
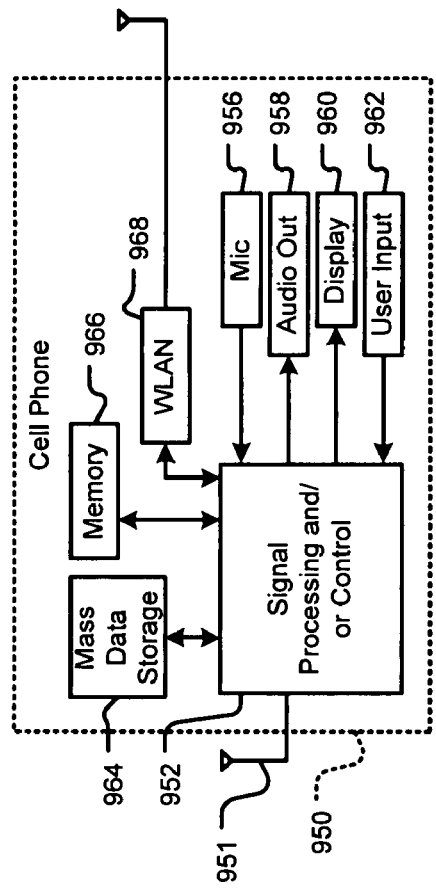
FIG. 9E is a diagram of an exemplary television set top box.

Referring now to FIG. 9E, the present invention can be implemented in a cellular phone 950 that may include a cellular antenna 951. The present invention may be implemented in either or both signal processing and/or control circuits, which are generally identified in FIG. 9E at 952, a WLAN interface and/or mass data storage of the cellular phone 950. In some implementations, the cellular phone 950 includes a microphone 956, an audio output 958 such as a speaker and/or audio output jack, a display 960 and/or an input device 962 such as a keypad, pointing device, voice actuation and/or other input device. The signal processing and/or control circuits 952 and/or other circuits (not shown) in the cellular phone 950 may process data, perform coding and/or encryption, perform calculations, format data and/or perform other cellular phone functions.

The cellular phone 950 may communicate with mass data storage 964 that stores data in a nonvolatile manner such as optical and/or magnetic storage devices (for example, hard disk drives [HDDs] and/or DVDs). At least one HDD may have the configuration shown in FIG. 9A and/or at least one DVD may have the configuration shown in FIG. 9B. The HDD may be a mini HDD that includes one or more platters having a diameter that is smaller than approximately 1.8". The cellular phone 950 may be connected to memory 966 such as RAM, ROM, low latency nonvolatile memory such as flash memory and/or other suitable electronic data storage. The cellular phone 950 also may support connections with a WLAN via a WLAN network interface 968.

Figure 9F:
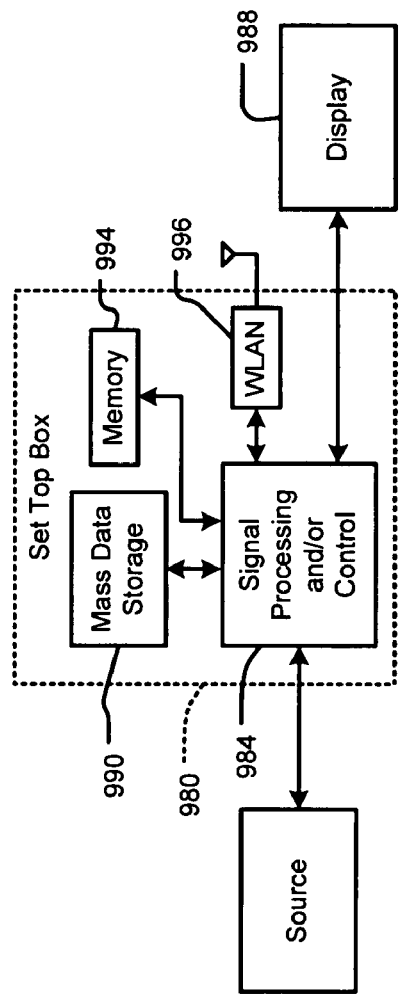
FIG. 9F is a diagram of an exemplary portable media player.
Figure 9G:
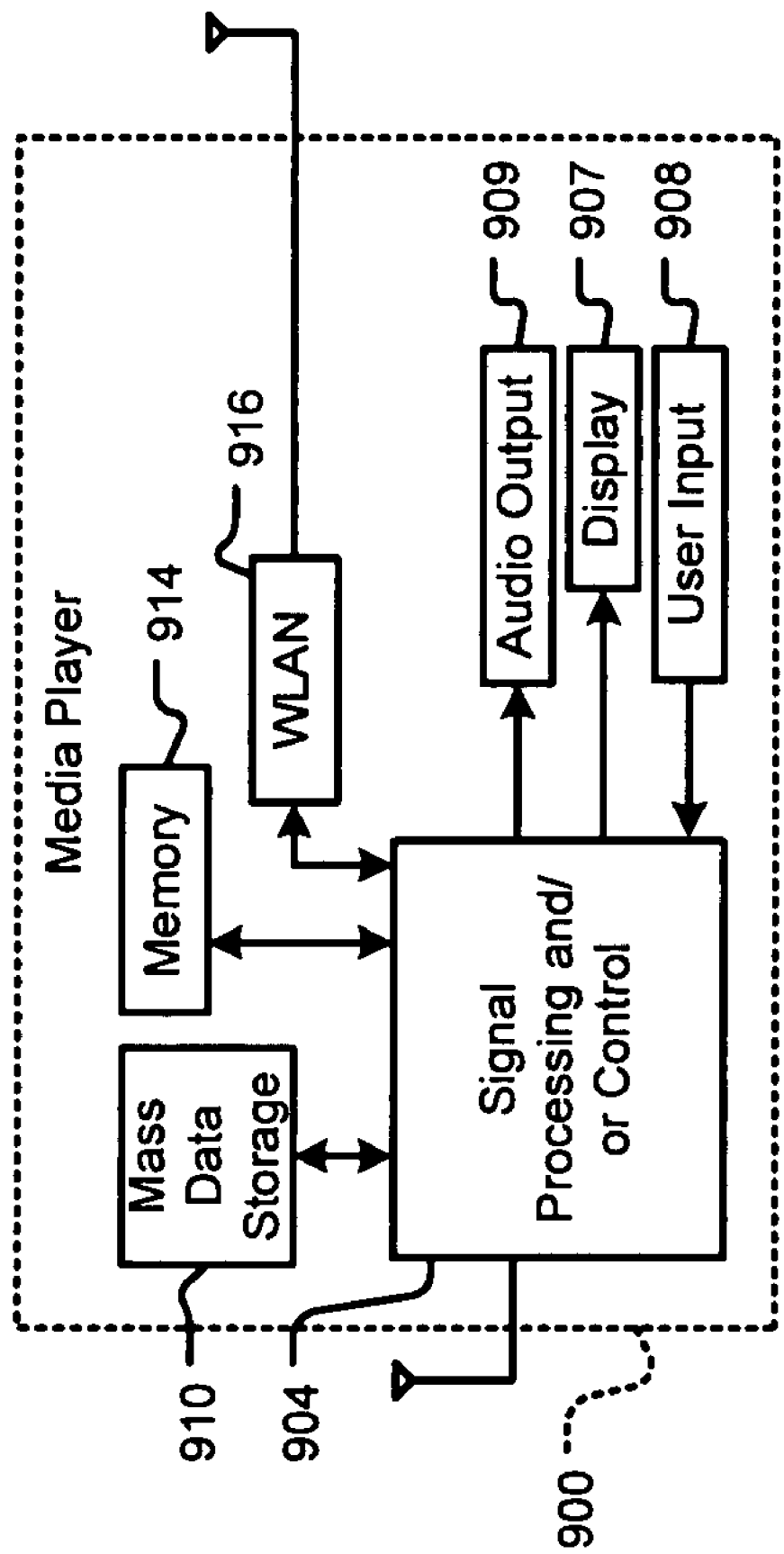
FIG. 9G is a diagram of an exemplary media player.

Referring now to FIG. 9F, the present invention can be implemented in a set top box 980. The present invention may be implemented in either or both signal processing and/or control circuits, which are generally identified in FIG. 9F at 984, a WLAN interface and/or mass data storage of the set top box 980. The set top box 980 receives signals from a source such as a broadband source and outputs standard and/or high definition audio/video signals suitable for a display 988 such as a television and/or monitor and/or other video and/or audio output devices. The signal processing and/or control circuits 984 and/or other circuits (not shown) of the set top box 980 may process data, perform coding and/or encryption, perform calculations, format data and/or perform any other set top box function.

The set top box 980 may communicate with mass data storage 990 that stores data in a nonvolatile manner. The mass data storage 990 may include optical and/or magnetic storage devices (for example, hard disk drives [HDDs] and/or DVDs). At least one HDD may have the configuration shown in FIG. 9A and/or at least one DVD may have the configuration shown in FIG. 9B. The HDD may be a mini HDD that includes one or more platters having a diameter that is smaller than approximately 1.8". The set top box 980 may be connected to memory 994 such as RAM, ROM, low latency nonvolatile memory such as flash memory and/or other suitable electronic data storage. The set top box 980 also may support connections with a WLAN via a WLAN network interface 996.

Referring now to FIG. 9F, the present invention can be implemented in a media player 1000. The present invention may be implemented in either or both signal processing and/or control circuits, which are generally identified in FIG. 9G at 1004, a WLAN interface and/or mass data storage of the media player 1000. In some implementations, the media player 1000 includes a display 1007 and/or a user input 1008 such as a keypad, touchpad and the like. In some implementations, the media player 1000 may employ a graphical user interface (GUI) that typically employs menus, drop down menus, icons and/or a point-and-click interface via the display 1007 and/or user input 1008. The media player 1000 further includes an audio output 1009 such as a speaker and/or audio output jack. The signal processing and/or control circuits 1004 and/or other circuits (not shown) of the media player 1000 may process data, perform coding and/or encryption, perform calculations, format data and/or perform any other media player function.

The media player 1000 may communicate with mass data storage 1010 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices (for example, hard disk drives [HDDs] and/or DVDs). At least one HDD may have the configuration shown in FIG. 9A and/or at least one DVD may have the configuration shown in FIG. 9B. The HDD may be a mini HDD that includes one or more platters having a diameter that is smaller than approximately 1.8". The media player 1000 may be connected to memory 1014 such as RAM, ROM, low latency nonvolatile memory such as flash memory and/or other suitable electronic data storage. The media player 1000 also may support connections with a WLAN via a WLAN network interface 1016. Still other implementations in addition to those described above are contemplated.

CONCLUSION/SUMMARY

Thus, the present invention provides circuits, systems, and methods for generating a delayed clock signal. The present invention advantageously provides clock delay generation at low power with a high degree of accuracy, independent of process, voltage, and temperature (PVT) variations.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A circuit for generating a delayed clock signal, said circuit comprising:
   a first ramp generator configured to produce a first ramp signal in response to a reference clock signal, and receive a first feedback signal;
   a first comparison circuit configured to compare said first ramp signal to a first threshold value in response to said reference clock signal to produce a comparison signal;
   a level shifting circuit configured to adjust said comparison signal to produce a level-shifted comparison signal;
   a second ramp generator configured to produce a second ramp signal in response to said level-shifted comparison signal; and
   a second comparison circuit configured to compare said second ramp signal to a second threshold value to produce said delayed clock signal.

2. The circuit of claim 1, wherein said first ramp signal is configured to reach a peak level when said reference clock signal has a transition.

3. The circuit of claim 1, further comprising:
   a low pass filter configured to receive said level-shifted comparison signal and to produce a first filtered comparison signal; and
   a first voltage controlled current source (VCCS) configured to produce said feedback signal in response to said first filtered comparison signal.

4. The circuit of claim 1, further comprising a first voltage controlled current source (VCCS) configured to produce said feedback signal in response to said level-shifted comparison signal.

5. The circuit of claim 4, wherein said ramp generator comprises a first capacitor.

6. The circuit of claim 5, wherein said second ramp generator comprises a second voltage controlled current source (VCCS) configured to produce a ramp control signal in response to said level-shifted comparison signal.

7. The circuit of claim 6, wherein said second VCCS comprises a replica of said first VCCS.

8. The circuit of claim 6, wherein said second ramp generator further comprises a second capacitor.

9. The circuit of claim 8, wherein said first VCCS comprises at least one transistor having a first finger number, and said second VCCS comprises at least one transistor having a second finger number.

10. The circuit of claim 9, wherein said delayed clock signal has a pulse width $\Delta t$ according to the equation:

$$\Delta t = T_{H1} * \frac{C_2 * M_1}{C_1 * M_2},$$

wherein $C_1$ is the capacitance of said first capacitor, $C_2$ is the capacitance of said second capacitor, $M_1$ is said first finger number, $M_2$ is said second finger number, and $T_{HI}$ is the pulse width of said reference clock signal.

11. An analog-to-digital converter comprising the circuit of claim 1.

12. A circuit for generating a delayed clock signal, said circuit comprising:
   a first ramp generator configured to produce a first ramp signal in response to a reference clock signal;
   a first comparison circuit comprising a first comparator and a level shifting circuit, said first comparator configured to compare said first ramp signal to a first threshold value in response to said reference clock signal, said level shifting circuit configured to level shift an output of said first comparator to produce a comparison signal;
   a second ramp generator configured to produce a second ramp signal in response to said comparison signal; and
   a second comparison circuit configured to compare said second ramp signal to a second threshold value to produce said delayed clock signal.

13. The circuit of claim 12, wherein said first ramp generator is further configured to receive a first feedback signal.

14. The circuit of claim 12, wherein said ramp generator comprises a first capacitor.

15. The circuit of claim 14, wherein said first capacitor has an average current flowing through it when said reference clock signal is high according to the equation:

$$I_{VCCS1} = V_T * C_1 / T_{HI},$$

wherein $I_{VCCS1}$ is said average current flowing through said first capacitor when said reference clock signal is high, $V_T$ is said threshold value of said first comparator, $C_1$ is the capacitance of said first capacitor, and $T_{HI}$ is the pulse width of said reference clock signal.

16. A method for generating a delayed clock signal, comprising the steps of:
   generating a first ramp signal in response to a reference clock signal;
   comparing said first ramp signal to a first threshold value in response to said reference clock signal to produce a comparison signal;
   adjusting said first ramp signal in response to said comparison signal;
   generating a second ramp signal in response to said comparison signal; and
   comparing said second ramp signal to a second threshold value to produce said delayed clock signal.

17. The method of claim 16, wherein said first ramp signal reaches a peak level when said reference clock signal has a transition.

18. The method of claim 16, wherein producing said comparison signal comprises level shifting said comparison signal to produce a level-shifted output.

19. The method of claim 18, wherein producing said comparison signal further comprises low-pass filtering said level-shifted output.

20. The method of claim 16, wherein said adjusting step comprises generating a feedback signal with a voltage controlled current source.

21. The method of claim 20, wherein said adjusting step comprises applying an average current through a first capacitor when said reference clock signal is high according to the equation:

$$I_{VCCS1} = V_T * C_1 / T_{HI},$$

wherein $I_{vccs1}$ is said average current, $V_T$ is said first threshold value, $C_1$ is the capacitance of said first capacitor, and $T_{HI}$ is the pulse width of said reference clock signal.

22. The method of claim 16, wherein said step of generating said first ramp signal comprises producing a first voltage controlled current in response to said comparison signal and said step of generating said second ramp signal comprises producing a second voltage controlled current in response to said comparison signal.

23. The method of claim 22, wherein said step of generating said first ramp signal further comprises applying said first voltage controlled current to a first capacitor, and said step of generating said second ramp signal further comprises applying said second voltage controlled current to a second capacitor.

24. The method of claim 23, wherein producing said first voltage controlled current comprises applying said comparison signal to a first voltage controlled current source (VCCS), and producing said second voltage controlled current comprises applying said comparison signal to a second VCCS.

25. The method of claim 24, wherein said delayed clock signal has a pulse width $\Delta t$ according to the equation:

$$\Delta t = T_{H1} * \frac{C_2 * M_1}{C_1 * M_2},$$

wherein $C_1$ is the capacitance of said first capacitor, $C_2$ is the capacitance of said second capacitor, $M_1$ is the finger number of said first VCCS, $M_2$ is the finger number of said second VCCS, and $T_{HI}$ is the pulse width of said reference clock signal.

* * * * *